US008826102B2

(12) United States Patent
Liu et al.

(10) Patent No.: US 8,826,102 B2
(45) Date of Patent: Sep. 2, 2014

(54) METHOD AND SYSTEM FOR ADAPTING FORWARD ERROR CORRECTION IN MULTICAST OVER WIRELESS NETWORKS

(75) Inventors: Hang Liu, Yardley, PA (US); Saurabh Mathur, Monmouth Junction, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 843 days.

(21) Appl. No.: 12/989,544

(22) PCT Filed: Apr. 29, 2008

(86) PCT No.: PCT/US2008/005495
§ 371 (c)(1),
(2), (4) Date: Aug. 2, 2011

(87) PCT Pub. No.: WO2009/134220
PCT Pub. Date: Nov. 5, 2009

(65) Prior Publication Data
US 2012/0011413 A1    Jan. 12, 2012

(51) Int. Cl.
*H03M 13/00* (2006.01)
*H04L 1/00* (2006.01)
*H03M 13/35* (2006.01)
*H03M 13/25* (2006.01)

(52) U.S. Cl.
CPC ............ *H04L 1/0009* (2013.01); *H04L 1/0056* (2013.01); *H03M 13/35* (2013.01); *H03M 13/25* (2013.01)
USPC ............ 714/774; 714/758; 714/776; 714/784

(58) Field of Classification Search
CPC ...................................................... H04L 1/0009
USPC .......................................... 714/752, 774, 776
See application file for complete search history.

(56) References Cited

U.S. PATENT DOCUMENTS

| 5,689,439 | A  | * | 11/1997 | Weerackody et al. | ........ 370/329 |
| 6,516,435 | B1 |   | 2/2003  | Tsunoda |   |
| 7,739,580 | B1 | * | 6/2010  | Fang et al. | .................... 714/776 |
| 7,751,446 | B2 | * | 7/2010  | Lee et al. | ...................... 370/487 |
| 7,831,896 | B2 | * | 11/2010 | Amram et al. | ................ 714/804 |

(Continued)

FOREIGN PATENT DOCUMENTS

| CN | 1617223  | 5/2005 |
| JP | 11136220 | 5/1999 |

(Continued)

OTHER PUBLICATIONS

Chou et al., "Error Control for Receiver-Driven Layered Multicast of Audio and Video Multimedia", IEEE Transactions , vol. 3, No. 1, pp. 108-122.

(Continued)

*Primary Examiner* — Esaw Abraham
(74) *Attorney, Agent, or Firm* — Robert D. Shedd; Jerome G. Schaefer

(57) ABSTRACT

A method and apparatus are described including receiving channel condition feedback from a device over a wireless channel, determining response to the channel condition feedback if a forward error correction coding rate is sufficient for the device to recover lost data, adjusting the forward error correction coding rate responsive to the second determining act and generating forward error correction packets using the adjusted forward error correction coding rate from source data.

20 Claims, 5 Drawing Sheets

(56) References Cited

U.S. PATENT DOCUMENTS

| | | | |
|---|---|---|---|
| 8,091,011 B2 * | 1/2012 | Rajakarunanayake et al. | 714/774 |
| 8,457,954 B2 * | 6/2013 | Takeuchi et al. | 704/224 |
| 2005/0113099 A1 | 5/2005 | Eriksson et al. | |
| 2005/0249240 A1 | 11/2005 | Boyce et al. | |

FOREIGN PATENT DOCUMENTS

| | | |
|---|---|---|
| JP | 2001045098 | 2/2001 |
| JP | 2002330118 | 11/2002 |
| JP | 2004201111 | 7/2004 |
| JP | 2005530386 | 10/2005 |
| JP | 2007243439 | 9/2007 |
| WO | WO03067843 | 8/2003 |
| WO | WO2005086436 | 9/2005 |
| WO | WO 2006121493 A1 | 11/2006 |
| WO | WO 2007073362 A1 | 6/2007 |
| WO | WO2008013528 | 1/2008 |

OTHER PUBLICATIONS

Matrawy et al: "A survey of congestion control schemes for multicast video applications" IEEE Communications Surveys, IEEE, New York, NY, US vol. 2, n° 2, Oct. 1, 2003, pp. 22-31.

* cited by examiner

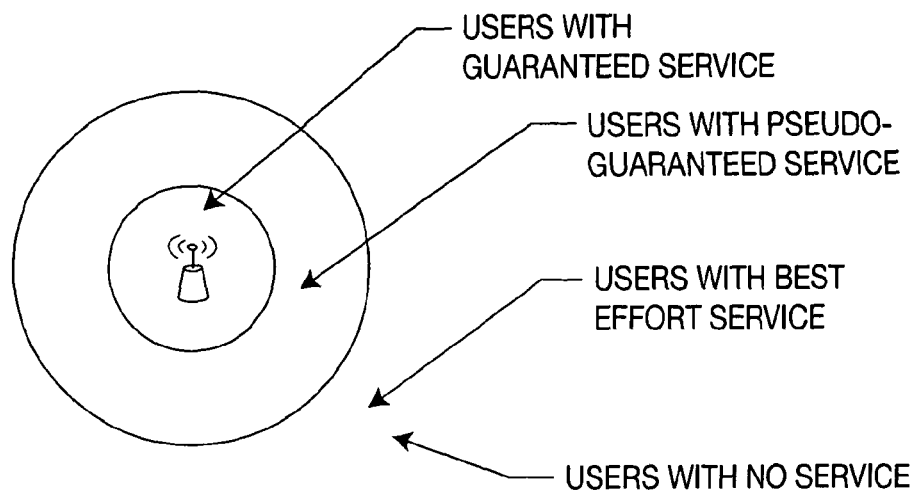
FIG. 3
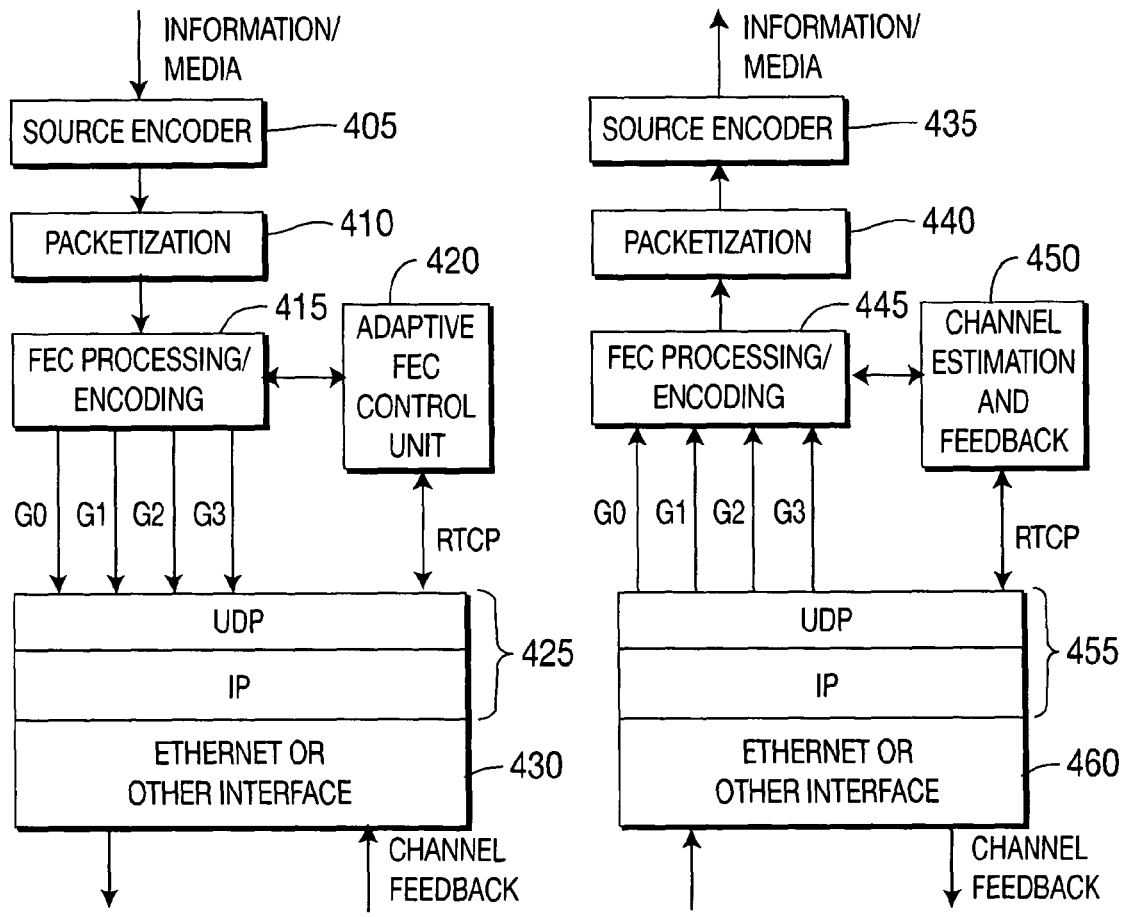
FIG. 4A  FIG. 4B

METHOD AND SYSTEM FOR ADAPTING FORWARD ERROR CORRECTION IN MULTICAST OVER WIRELESS NETWORKS

This application claims the benefit, under 35 U.S.C. §365 of International Application PCT/US08/04595, filed Apr. 29, 2008, which was published in accordance with PCT Article 21(2) on Nov. 5, 2009 in English.

FIELD OF THE INVENTION

The present invention relates to wireless networks and, in particular, to an adaptive forward error correction (FEC) method and system for efficiently delivering multicast data over wireless networks.

BACKGROUND OF THE INVENTION

Multicast over wireless networks enables the distribution of data such as live video or prerecorded entertainment programs to many receivers efficiently. One example of multicast is the redistribution of several TV programs or location specific video information in hot spots such as airports over an IEEE 802.11 wireless local area network (WLAN). The users of receivers can watch their favorite TV programs on the mobile devices while browsing the Internet. Other applications include movie previews outside cinemas, replaying of the most important scenes from a football game, etc. over wireless networks. As used herein, a mobile device includes end devices, client devices, mobile terminals, laptops, dual mode smart phones, personal digital computers, etc.

The error rate is usually high in wireless networks. For multicast, the wireless link layer generally does not perform retransmission of lost packets. The data frames are discarded at the receiver in the event of an error. The required reliability cannot then be guaranteed to the receivers without excellent receiving conditions. Furthermore, in a video multicast application, the receivers for the same video may experience different channel conditions and the channel condition for a receiver may vary at different times due to multipath fading, shadowing, interference and mobility. New receivers may join during the session or some receivers may leave so that the network topology of receivers changes. Therefore, additional error protection mechanisms are required to provide satisfying and reliable quality of services for receivers within the serving area while efficiently utilizing the available wireless bandwidth. To achieve reliable wireless multicast operation, one of the effective approaches is to employ forward error correction (FEC) codes at the application layer.

In some reported systems, a fixed FEC code is selected to satisfy a target quality for the receiver with the worst channel conditions (i.e., the highest loss rate) in the serving area. With this approach, the fixed FEC code (for example, a fixed Reed-Solomon (RS) code) is applied across the information source packets at the application layer to generate the parity packets. The parity packets are transmitted with the information source packets and are used to recover the lost information source packets. With the above approach, the FEC code is fixed and applied even if all the receivers have good channel conditions. Unnecessary FEC parity packets introduce high overhead so that the bandwidth efficiency is reduced. Adaptive FEC has been used in unicast systems. The FEC code rate is adapted according to the channel conditions of the single receiver. In the present invention, multicast applications are considered. Multiple receivers of the same source may experience different packet loss rates at the same time, and the same receiver may also experience different packet loss rates at different times. The receiving qualities at different receivers or the same receiver, at different times, differ. Furthermore, receivers may join or leave the multicast group.

The problem to be solved in the present invention is to select and adapt the FEC code parameters. It would be advantageous to design an effective adaptive FEC method. In order to design an effective adaptive FEC method three problems need to be addressed (1) how to estimate the channel conditions of multiple receivers in multicast (2) how to provide the channel condition feedback (3) how to adapt the FEC rate based on the channel status of multiple receivers.

SUMMARY OF THE INVENTION

As used herein multicast is a transmission of data including but not limited to audio and video data. That is, the data may be any form of data. For ease of examples, video data is used herein. Also as used herein unicast is a one-to-one transmission of data. That is, data is transmitted from a single source to a single receiver. Broadcast is the one-to-all transmission of data. That is, data is transmitted to all receivers that are capable of receiving the data transmission. Multicast is a one-to-many data transmission. Multicast data transmission is to a subset of all the receivers capable of receiving the transmission, where the subset may be all of the receivers capable of receiving the data transmission. That is, as used herein multicast includes broadcast so is more general.

The present invention describes an adaptive forward error correction (FEC) method and system for efficiently and reliably delivering multicast data over wireless networks. In wireless multicast applications, data are transmitted from the access point/base station to multiple receivers over a wireless channel. As used herein, "/" denotes alternative names for the same or similar components or structures. That is, a "/" can be taken as meaning "or" as used herein. The present invention adaptively changes the capability and overhead of the FEC codes for system performance optimization by taking into account the receiver topology changes, varying channel conditions of multiple receivers, and application requirements. Receivers are categorized into different classes. Different levels of quality of service (QoS) are provided to different classes of receivers by careful design of the FEC adaptation scheme. An optimal cross-layer design strategy is described which selects the physical layer operation mode, packet size and application layer FEC to guarantee the reliability requirements for certain targeted receivers while maximizing the overall system throughput. Furthermore, extra FEC overhead is dynamically transmitted in different multicast groups with different priorities to enhance the multicast robustness for the receivers with degraded channel conditions in the serving area. The extra FEC overhead can adapt to the varying receiver topology and wireless network conditions based on the feedback of multiple receivers. The adaptive FEC system consists of (1) a channel estimation method operating at each receiver, that estimates the receiving channel conditions (2) a protocol, that sends the channel condition feedback from multiple receivers to the data/media/multicast server (3) a FEC adaptation method operating at the multicast server, that dynamically changes the FEC code rate and transmission priority based on the channel conditions of multiple receivers.

The problem to be solved in the present invention is to select and adapt the FEC code parameters. It would be advantageous to design an effective adaptive FEC method. In order to design an effective adaptive FEC method three problems need to be addressed (1) how to estimate the channel conditions of multiple receivers in multicast (2) how to provide the channel condition feedback (3) how to adapt the FEC rate based on the channel status of multiple receivers. The present invention, therefore, describes a method and system to adapt the FEC code rate and to transmit the information source and parity packets in different multicast groups with different priorities to optimize the system performance.

A method and apparatus are described including receiving channel condition feedback from a device over a wireless channel, determining, based on the received feedback, whether the device can be served, determining if a forward error correction coding rate is sufficient for the device to recover lost data, adjusting the forward error correction coding rate responsive to the second determining act and generating forward error correction packets using forward error correction coding rate from said source data.

BRIEF DESCRIPTION OF THE DRAWINGS

The present invention is best understood from the following detailed description when read in conjunction with the accompanying drawings. The drawings include the following figures briefly described below where like-numbers on the figures represent similar elements:

FIG. 3 is a diagram showing the different classes of receivers.

FIG. 4A is a diagram of the protocol structure of a multicast server employing the adaptive forward error correction coding method of the present invention.

FIG. 4B is a diagram of the protocol structure of a receiver employing the adaptive forward error correction coding method of the present invention.

DETAILED DESCRIPTION OF THE PREFERRED EMBODIMENTS

Figure 1:
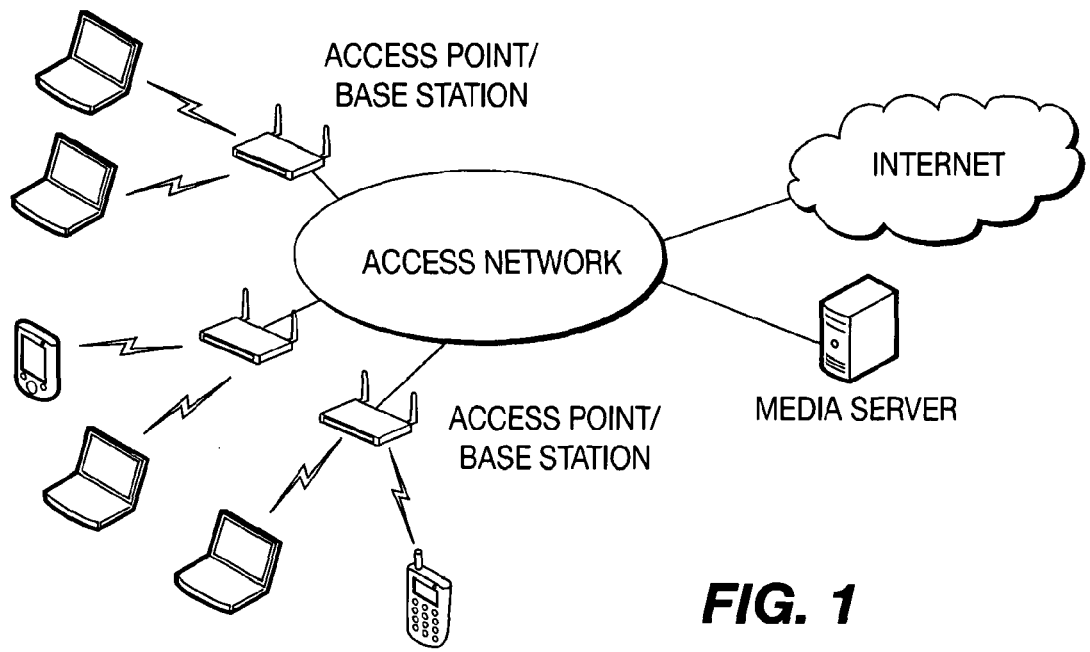
FIG. 1 is a schematic diagram of a network of the type for which the present invention is used.

Referring to FIG. 1, a typical network system considered in the present invention is shown. The mobile devices 105 are connected to a multicast server 120 (e.g., video multicast server or media server) and the Internet 125 through wireless access points/base stations 110 and a high-speed wired access network 115 (e.g. Ethernet). The video server 120 multicasts one or more video programs over the high-speed wired access network 115 to the wireless access points/base stations. The access points/base stations 110 then distribute the video to the mobile devices 105 in multicast over the wireless links. The users of the mobile devices can view one or more video programs and simultaneously access the Internet. The adaptive forward error correct (FEC) method and system described herein can be used in video multicast applications over wireless local area networks (WLAN), 3G networks, or other wireless networks. IEEE 802.11 WLAN networks are used as an example to describe the adaptive FEC method and system of the present. Furthermore, the present invention is independent of the type of data that is being transmitted, and can be used for the transmission of any type of data, and is not limited to audio/video programs although video multicast is used as an example to describe the adaptive FEC method and system of the present invention.

The multicast server includes, among other things, a source data (e.g., video) encoder/packetizer that generates a stream of data packets (e.g., video packets), and a FEC encoder that applies cross-packet FEC coding to the video packets. The FEC used can be any systematic forward error correction code, for example, Reed-Solomon (RS) codes. The FEC code is used across the packets to protect against loss (erasure) of entire packets because the erroneous packets are often discarded by the lower layer. If the FEC coding is applied within a single packet at the application layer, it will not be available for correcting the erroneous packets at the application layer. For example, a (N, K) RS code is applied to K source packets to form H=(N−K) parity packets. The FEC code rate is defined as R=K/N.

In multicast/broadcast, multiple receivers of the same video stream may experience different packet loss rates due to different channel conditions at the same time, and the same receiver may also experience different packet loss rates at different times. New receivers may join during the multicast session or some receivers may leave during the multicast session so that the topology of receivers changes. The present invention describes a method and system to adaptively change the capability and overhead of the FEC codes according to the network topology and varying channel conditions of multiple receivers for efficient and robust video multicast over wireless networks.

Figure 2:
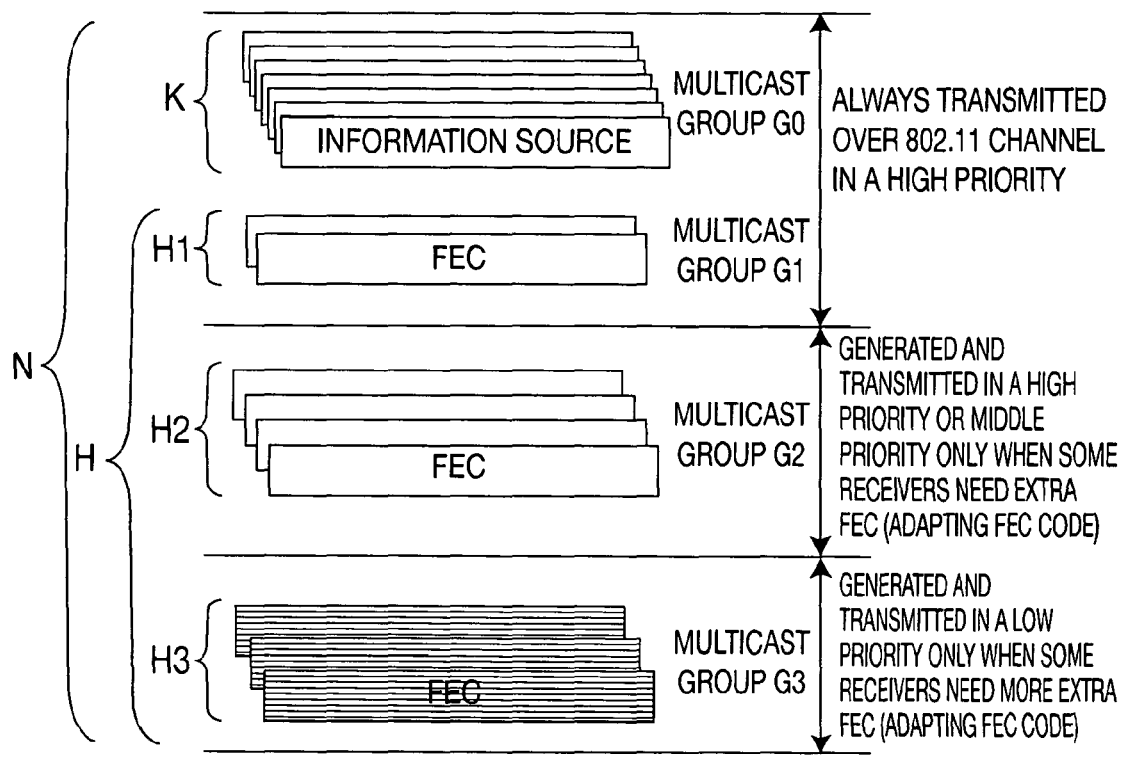
FIG. 2 is a block diagram of the adaptive forward error correction method of the present invention.

FIG. 2 is a block diagram of the adaptive forward error correction method of the present invention. Given a block of K video source packets in a video stream (K can be determined according to desired delay and coding complexity), the number of FEC parity packets generated and transmitted over wireless networks H=(N−K), where N is the total number of packets for this coding block (source packets and parity packets), is adapted between $H_{min}$ and $H_{max}$. That is, the FEC code rate R=K/N=K/(K+H) is adapted between $R_{max}$=K/(K+$H_{min}$) and $R_{min}$=K/(K+$H_{max}$). Furthermore, the video source packets are transmitted in a multicast group G0 with highest priority. The parity packets are transmitted in multiple multicast groups (different IP addresses and/or UDP ports) with different priorities. Of H parity packets, H1 parity packets are always transmitted in a multicast group G1 with the highest priority (the same priority as the video source packets). Another H2 parity packets are generated and transmitted in a different multicast group G2 with the high priority or a medium priority (a priority lower than video source packets but higher than the best effort data traffic) only when some receivers need extra FEC (adaptive FEC code). The remaining H3 parity packets are generated and transmitted in the multicast group G3 with a low priority (the same priority as the best effort data traffic or a priority lower than the best effort data traffic) only when some receivers need even more extra FEC. The total number of parity packets H is equal to, $H_{min} \leq H = H_1 + H_2 + H_3 \leq H_{max}$, (N=K+$H_1$+$H_2$+$H_3$).

An alternative is to keep the encoding block length N fixed, but vary K, $H_1$, $H_2$, and $H_3$. The present invention further describes a method to determine the parameters $H_{min}$, $H_1$, $H_2$, $H_3$ and $H_{max}$ as described in details below.

For backward compatibility, non-FEC capable receivers just do not accept data from the multicast groups for FEC parity packets so that the adaptive FEC multicast system can be used with mixed FEC-capable and non-FEC-capable receivers.

FIG. 3 is a diagram showing the different classes of receivers. The coverage area of a wireless access point/base station is divided into four regions based on the channel conditions in terms of raw packet loss rate. The receivers in the area covered by the innermost circle have guaranteed service. Those in the next circle have pseudo-guaranteed service. Those receivers in the next circle have best effort service, and those receivers outside of the circles are not provided with any service (they are out of service area). The raw packet loss rate is defined as the packet loss rate before FEC decoding. Correspondingly, receivers are categorized into different classes based on their receiving channel conditions. The FEC parameters $H_{min}$, $H_1$, $H_2$, $H_3$ and $H_{max}$ are determined and adapted to provide different classes of receivers with different levels of transmission reliability measured in terms of residual packet loss rate. The residual packet loss rate is defined as the packet loss rate after FEC decoding.

For guaranteed service receivers, the physical layer mode of the access point/base station, packet size and application layer FEC code rate are chosen jointly to maximize the throughput while guaranteeing their transmission reliability. This can be done by the network/system administrator. For receivers with pseudo-guaranteed services, the adaptive FEC method of the present invention dynamically adjusts the FEC overhead based on varying network topology and the channel conditions experienced by different receivers to guarantee their transmission reliability. For receivers with best effort service, the adaptive FEC method of the present invention attempts to satisfy their transmission reliability requirements in best-effort fashion, i.e. when any extra bandwidth for FEC overhead is available. The extra FEC overhead added for the best effort service receivers are transmitted in low priority over wireless networks. If not enough bandwidth is available in the wireless networks, the extra FEC overhead is discarded by the access point/base station. To guarantee a certain quality of service for receivers with very bad channel conditions would consume too much in the way of system resources. Instead, the receivers with the poorest/worst channel conditions are not served, i.e. the FEC code rate is not adapted based on these receivers.

The network/system administrator first determines a desired coverage region of a wireless access point/base station, for example it could be perhaps a building, in which any receivers will be guaranteed to have an average residual packet loss rate less than or equal to a threshold $P_t$. The threshold $P_t$ is determined by the requirements of the application, i.e. $10^{-5}$ is reasonable for excellent video quality. The receivers in this region are termed guaranteed service (GS) receivers. Given a fixed transmit power $S=S_0$ of the access point/base station, the worst average channel SNR $\gamma_1$ in the region can be obtained through experimental measurements or analysis. Note that the channel SNR is time-varying due to fading. The average channel SNR over time is used to measure the channel condition of a receiver. The channel conditions of a receiver depend on the distance from the access point/base station, geographical environment, etc. The physical layer operation mode M of the access point/base station, packet size L and application layer FEC code parameters $H_{min}$ are then chosen jointly to guarantee the transmission reliability of GS receivers (i.e. the residual packet loss rate, $P_r$, of these receivers is less than or equal to $P_t$) and to maximize the application layer goodput G. Note that the packet size should not be greater than the maximum transport unit (MTU) allowed by the network. The above is a constrained optimization problem and can be formulated as $$\text{Max} G(M,L,H_{min})|_{s=s0,\gamma=\gamma 1}, P_r(M,L,H_{min})|_{s=s0,\gamma=\gamma 1} \leq P_t \quad (1)$$
$$\text{and } L \leq \text{MTU}$$

For some cases, it is possible that the packet size and the physical layer mode are determined a priori, for example, based on the MTU and access point/base station capability. If so, $H_{min}$ is chosen to guarantee that the residual packet loss rate is not greater than $P_t$. If the (N, K) RS code is used, H=N−K parity packets transmitted provide an erasure resiliency against H lost packets out of N packets. If the raw packet loss rate before FEC decoding is $P_e$, then $H_{min}$ satisfies $$P_t = 1 - \sum_{d=0}^{H_{min}} \binom{K+H_{min}}{d} (p_e)^d (1-P_e)^{K+H_{min}-d} \quad (2)$$

Given a block of K source packets, if $H_{min}$ parity packets are transmitted with the physical layer mode M of the access point/base station and packet size L determined by Equation (1), the residual packet loss rate after FEC decoding will be less than or equal to $P_t$ for GS receivers with a channel SNR $\gamma \geq \gamma_1$. The corresponding FEC code rate is $$R_{max} = K/(K+H_{min}) \quad (3)$$

The FEC code rate determined above is the minimum strength/overhead FEC code used by the multicast system. It satisfies the transmission reliability requirement for the guaranteed receivers with a channel SNR greater than $\gamma_1$ or the raw packet loss rate before FEC decoding less than $P_e$ ($\gamma_1$). However, the required reliability cannot be satisfied by the receiver with poorer/degraded channel conditions. In the present invention, when there are receivers with less than desirable channel SNR, i.e. their channel SNR less than $\gamma_1$, in the serving area, the FEC code rate R (i.e. the error correction capability/overhead H, R=K/(K+H)) is dynamically adjusted based on their channel conditions in order to keep the residual packet loss rate of these receivers less than a targeted value $P_t$. $P_t$ is the threshold of average residual packet loss rate after FEC decoding. When all of the receivers of a video stream in the service area have a channel SNR greater than or equal to $\gamma_1$, the FEC overhead for this video stream is kept minimal, i.e. the FEC code rate equals $R_{max}$ and the conserved bandwidth can be used for other video streams or best-effort data traffic.

Consider that J video streams are being transmitted in multicast over a wireless channel and suppose that the total bandwidth of the wireless channel at the application layer is $B_t$. Assume that the source rate for stream j is $S^j$ and the FEC code rate is $R_{max}$ for every stream (i.e. the overhead of the FEC code is equal to the minimum value to satisfy the reliability requirement of guaranteed receivers). The remaining bandwidth is $$B_r = B_t - \sum_{i=1}^{J} \frac{S^i}{R_{max}} \quad (4)$$

If all the remaining bandwidth is used to provide extra FEC protection to a stream j, the FEC code rate for stream j will be $$R_{min}^j = S^j \bigg/ \left(B_t - \sum_{i=1, i \neq j}^{J} \frac{S^i}{R_{max}}\right) \quad (5)$$

It is the minimum FEC code rate that can be applied for stream j under the channel bandwidth constraint. The corresponding maximum FEC overhead is $$H_{max}^j = N - K = (K/R_{min}^j) - K \quad (6)$$

With this FEC, to achieve the residual packet loss rate equal to the targeted value $P_t$, the raw packet loss rate of the stream j before FEC decoding should be less than a value $P_{max}$. If the RS (N, K) code is used, then $P_{max}$ satisfies $$P_t = 1 - \sum_{d=0}^{H_{max}} \binom{K + H_{max}}{d} (p_{max})^d (1 - P_{max})^{K + H_{max} - d} \quad (7)$$

If all J streams are to be equally protected with the available total bandwidth, i.e. the same FEC code rate is applied to all the streams, the FEC code rate is then $$R_{ave} = \sum_{i=1}^{J} \frac{S^i}{B_t} \quad (8)$$

The corresponding FEC overhead is $$H_{ave} = N - K = (K/R_{ave}) - K \quad (9)$$

With this FEC overhead, to achieve the residual packet loss rate equal to the targeted value $P_t$, the raw packet loss rate before FEC decoding should be less than a value $P_{ave}$. If the RS (N, K) code is used, then $P_{ave}$ satisfies $$P_t = 1 - \sum_{d=0}^{H_{ave}} \binom{K + H_{ave}}{i} (p_{ave})^d (1 - P_{ave})^{K + H_{ave} - d} \quad (10)$$

In the present invention, the FEC code rate is dynamically changed between $R_{max}$ and $R_{min}$ based on the network topology and channel conditions of multiple receivers in order to utilize the bandwidth efficiently and achieve statistical multiplexing gain of multiple video streams. The $R_{max}$ and $R_{min}$ are determined by Equations (3) and (5), respectively. Given a block of K source packets, the number of parity packets transmitted H changes between $H_{min}$ and $H_{max}$. $H_{max}$ is determined by Equation (6) and $H_{min}$ satisfies Equation (2).

If the raw packet loss rate for a receiver i is less than or equal to the threshold $P_e(\gamma_1)$ that is determined by the network/system administrator to guarantee the transmission reliability, i.e. $P_i \leq P_e(\gamma_1)$, the receiver is a guaranteed service receiver. The present adaptive FEC method guarantees its residual packet loss rate after the FEC decoding to be less than or equal to the targeted value $P_t$. This is achieved by setting the maximum FEC code rate $R_{max}$ and transmitting at least $H_{min}$ parity packets with high priority.

If the raw packet loss rate for a receiver i of video stream j is between $P_e(\gamma_1)$ and $P_{ave}$, i.e. $P_e(\gamma_1) < P_i^j \leq P_{ave}$, the receiver is classified as pseudo-guaranteed service receiver. $P_{ave}$ is the raw packet loss rate with which the residual packet loss rate is equal to the targeted value $P_t$ if all J streams are equally protected with the available total bandwidth, i.e. the same FEC code rate is applied to all of the streams. The present method adapts the FEC code rate of stream j based on the worst case receiver among all current pseudo-guaranteed service receivers of stream j and transmits the FEC overhead required by these receivers in the high priority or a medium priority. This ensures that the residual packet loss rate of all the pseudo-guaranteed service receivers currently in the serving area is less than or equal to the targeted value $P_t$. The raw packet loss rates of receivers are estimated and sent from the receivers to the media server periodically so that the media server can determine the FEC code rate. The packet loss rate may have a burst that is over the targeted value $P_t$ during the interval between the FEC adaptations. The transmission reliability for these receivers is thus pseudo-guaranteed.

If the raw packet loss rate for a receiver i of stream j is in the range $P_{ave} < P_i^j \leq P_{max}^j$, the receiver is classified as the best effort service user. $P_{max}^j$ is the raw packet loss rate with which the residual packet loss rate after FEC decoding is less than or equal to the targeted value $P_t$ if all the remaining bandwidth is used to protect the stream j. The method adapts the FEC code rate based on the worst case receiver among all best effort service receivers. However, the extra FEC overhead required for these best effort service receivers is transmitted with a low priority. If there are enough resources in the wireless networks, the extra FEC overhead is transmitted by the access point/base station. The transmission reliability of these best effort service receivers are satisfied, i.e. the residual packet loss rate after FEC decoding is less than or equal to the targeted value $P_t$. Otherwise, the extra parity packets are discarded by the access point/base station in which case, the transmission reliability of these best effort service receivers cannot be satisfied. In this sense, these receivers are served in best effort fashion.

The method of the present invention results in more efficient network resource utilization and achieves statistical multiplexing gain without compromising the reliability of guaranteed and pseudo-guaranteed receivers. For example, the receivers of multicast streams 1, 2, . . . j−1 all have very good channel conditions. The total bandwidth used for multicast streams 1, 2, . . . , j−1 (information and FEC overhead) is then less than the total bandwidth of the wireless channel. Some receivers for stream j incur bad channel conditions. The remaining available bandwidth can be used for extra FEC overhead (parity packets) to satisfy the requirements of these stream j receivers.

If the raw packet loss rate for a receiver i of stream j is greater than $P_{max}^j$, $P_i^j > P_{max}^j$, the receiver is classified as a no service receiver. This class of receivers experiences very bad channel conditions. To guarantee a certain packet loss rate for this class will consume too much in the way of system resources. Instead, the media server ignores them, i.e. the FEC code rate is not adapted based on these receivers.

The method to adapt FEC code rate or the amount of FEC overhead consist of (1) a channel estimation method operating at each receiver; (2) a protocol that sends the channel condition feedback from multiple receivers to the media server. (3) a FEC adaptation method operating at the video multicast server, that dynamically adjusts the FEC code rate and priority based on the channel conditions of multiple receivers.

Each receiver estimates its raw packet loss rate before the FEC decoding and sends this feedback to the media server. The raw packet loss rate before FEC decoding is indicative of the channel conditions. The feedback can be sent using Real-Time Transport Control Protocol (RTCP) or other equivalent means. In the present invention, the raw packet loss rate is estimated through a running, weighted average over the most recent measurements. Assume that receiver i receives a multicast video stream j, receiver i estimates and reports the raw packet loss rate every T time interval (T is configuration parameter). At time t, the reported raw packet loss rate at receiver i receiving stream j is $P_i^j$ and the average raw packet loss rate at receiver i receiving stream j is $$aveP_i^j(t)=\beta P_i^j(t)+(1-\beta)aveP_i^j(t-1) \quad (11)$$

where $\beta \leq 1$ is a design parameter. This report is sent to the media server.

During every time interval T, the media server may receive channel feedback from one or more receivers of a video stream j. After receiving a report at time t from a receiver i for a stream j with the raw packet loss rate $P_i^j(t)$, the media server determines the required FEC rate $P_i^j(t)$ for stream j to guarantee the residual packet loss rate less than or equal to the targeted value $P_t$. The relationship between the required FEC rate and the raw packet loss rate depends on the FEC code. For (N, K) RS code, the code rate $R_i^j = K/N$ can be determined by $$P_t = 1 - \sum_{d=0}^{N-K} \binom{N}{d} (p_i^j(t))^d (1-P_i^j(t))^{N-d} \quad (12)$$

where either K or N is known.

The adaptation algorithm operates as follows,

1. If $R_i^j(t) < R_{min}^j$ (i.e. $P_i^j(t) > P_{max}^j$), receiver i is ignored, that is, receiver i is out of service area and is a "no service" receiver. The media/multicast server does not try to serve this receiver and the FEC code rate is not adapted based on its channel condition.

2. If $R_0^j > R_i^j(t) \geq R_{min}^j$ (i.e. $P_0^j < P_i^j(t) \leq P_{max}^j$), set $R_0^j = R_i^j(t)$ where $R_0^j$ is the current FEC code rate used for stream j. Change the FEC code rate used for stream j to $R_0^j$. In this case, receiver i is a receiver to be served. It is either a "guaranteed service" or a "pseudo guaranteed service" or a "best effort service" receiver. To server this receiver (that is, to try to add enough FEC so that the residual packet loss rate of this receiver after FEC decoding is less than or equal to the threshold value $P_t$, the media/multicast server needs to make sure the current FEC code is strong enough, i.e. the code rate is less than or equal to $R_i^j(t)$. Otherwise, the residual packet loss rate of this receiver after FEC decoding would be greater than the threshold value $P_t$. If $R_0^j > R_i^j(t) \geq R_{min}^j$, then the current FEC code rate is changed to $$R_0^j = R_i^j(t). \quad (12a)$$

3. If $R_i^j(t) \geq R_0^j$ (i.e. $P_i^j(t) \leq P_0^j$), wait for the end of the time period [[t]] t. In this case, the currently used FEC code is strong enough to make sure that the residual packet loss rate of this receiver after FEC decoding is less than or equal to the threshold value $P_t$. The FEC code rate does not have to be changed immediately. It can wait for the channel reports from other receivers. At the end of the time interval T, assume I reports for stream j have been received during the time period T. Obtain the maximum value of the raw packet loss rate of these reports $$P_0^j = \max\{P_1^j, P_2^j, \ldots P_I^j\} \forall P_i^j < P_{max}^j \quad (13)$$

Next, obtain the FEC code rate $R_0^j$ to guarantee the residual packet loss rate equal to the targeted value $P_t$ for the user with the raw packet loss rate $P_0^j$. If (N, K) RS code is used, $R_0^j = K/N$ can be obtained by $$P_t = 1 - \sum_{d=0}^{N-K} \binom{N}{d} (p_0^j(t))^d (1-P_0^j(t))^{N-d} \quad (14)$$

where either K or N is known. Set $$R_0^j = \min(R_{max}, R_0^j) \quad (14a)$$

and change the FEC code rate used for stream j to $R_0^j$.

For some FEC codes, the available code rate is discrete, i.e. not every code rate is available. If the FEC code rate determined by the above is not available. Set $R_0^j$ to the next available code rate less than the current value of $R_0^j$. For example, the code rate determined by the above is 9/12 and the next available code rate (less than 9/12) is K/N=4/6<9/12. Set $R_0^j = 4/6$ and change the code rate used for stream j to 4/6.

Once the code rate $R_0^j$ is determined or adjusted as described above, the code rate $R_0^j$ is used for FEC generation at the multicast server. Given a block of K source packets, the required FEC overhead can be obtained by $H=(K/R_0^j)-K$. The source and FEC parity packets are transmitted in four multicast groups G0, G1, G2 and G3 with different priorities.

K source packets are transmitted in the multicast group G0 with the high priority.

If $H_{min} \leq H \leq H_{ave}$, the first $H_1 = H_{min}$ parity packets are transmitted in the multicast group G1 with the highest priority (the same priority as the source packets). The remaining $H_2 = H - H_{min}$ parity packets are transmitted in the multicast group G2 with the high priority or the middle priority.

If $H \geq H_{ave}$, the first $H_1 = H_{min}$ parity packets are transmitted in the multicast group G1 with the highest priority. The next $H_2 = H_{ave} - H_{min}$ parity packets are transmitted in the multicast group G2 with high priority or medium priority. The remaining $H_3 = H_0 - H_{ave}$ parity packets are transmitted in the multicast group G3 with a low priority.

FIG. 4A is an exemplary diagram of the protocol structure of a multicast server employing the adaptive forward error correction coding method of the present invention. The media server includes the source (e.g., video) encoder 405, packetization module 410, FEC processing/encoding module 415, adaptive FEC control unit 420, and UDP/IP communication unit 425 and interface 430. The adaptive FEC control unit 420 receives the feedbacks from multiple receivers. It determines the FEC code rate and the transmission priority of source (e.g., video) and parity packets using the method described above. The adaptive FEC control unit instructs the FEC processing/encoding module 415 to perform the FEC encoding and the UDP/IP communication unit 425 to transmit the source packets and parity packets in the desired priorities.

FIG. 4B is an exemplary diagram of the protocol structure of a receiver employing the adaptive forward error correction coding method of the present invention. The receiver includes the source (e.g., video) decoder 435, de-packetization module 440, FEC processing/decoding module 445, channel estimation and feedback module 450, and UDP/IP communication unit 455 and interface 460. The channel estimation and feedback module 450 estimates the raw packet loss rate (indicative of channel conditions) using the method described above and sends it periodically to the media server through the UDP/IP communication unit 455 and interface 460.

Figure 5:
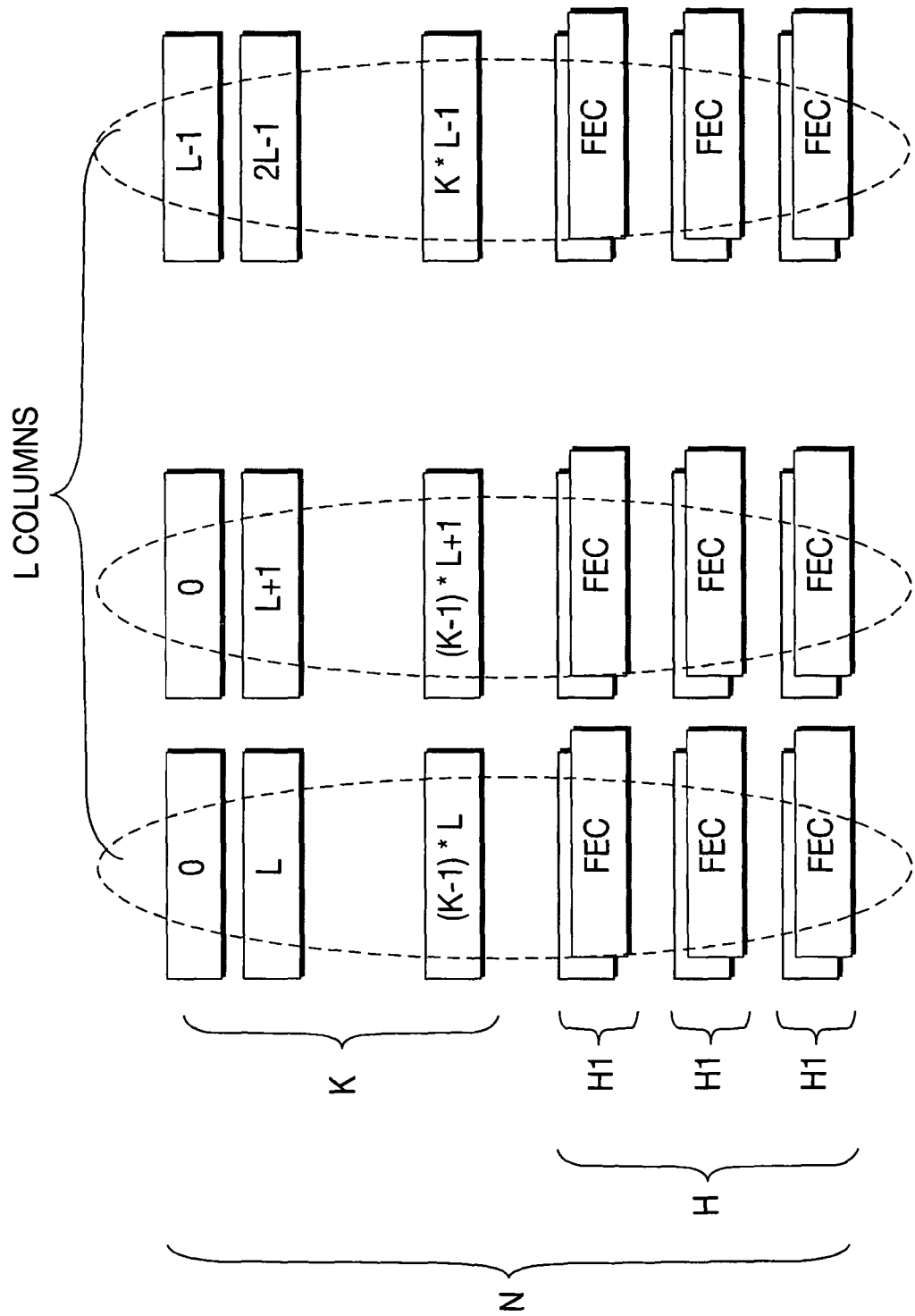
FIG. 5 is a diagram of the adaptive forward error correction coding of the present invention.

FIG. 5 is a diagram of the adaptive forward error correction coding of the present invention. The source packets are arranged in K rows and L columns. The total number of packets including the forward error correction packets are arranged in N rows and L columns. The FEC packets are generated using the FEC coding rate and separated into several multicast groups, for example, multicast groups H1, H2 and H3 for a total of H multicast groups. Packets in multicast group H1 are always transmitted and are transmitted with a high priority. The FEC packets in the other multicast groups are transmitted only if necessary to recover the source packets.

Figure 6:
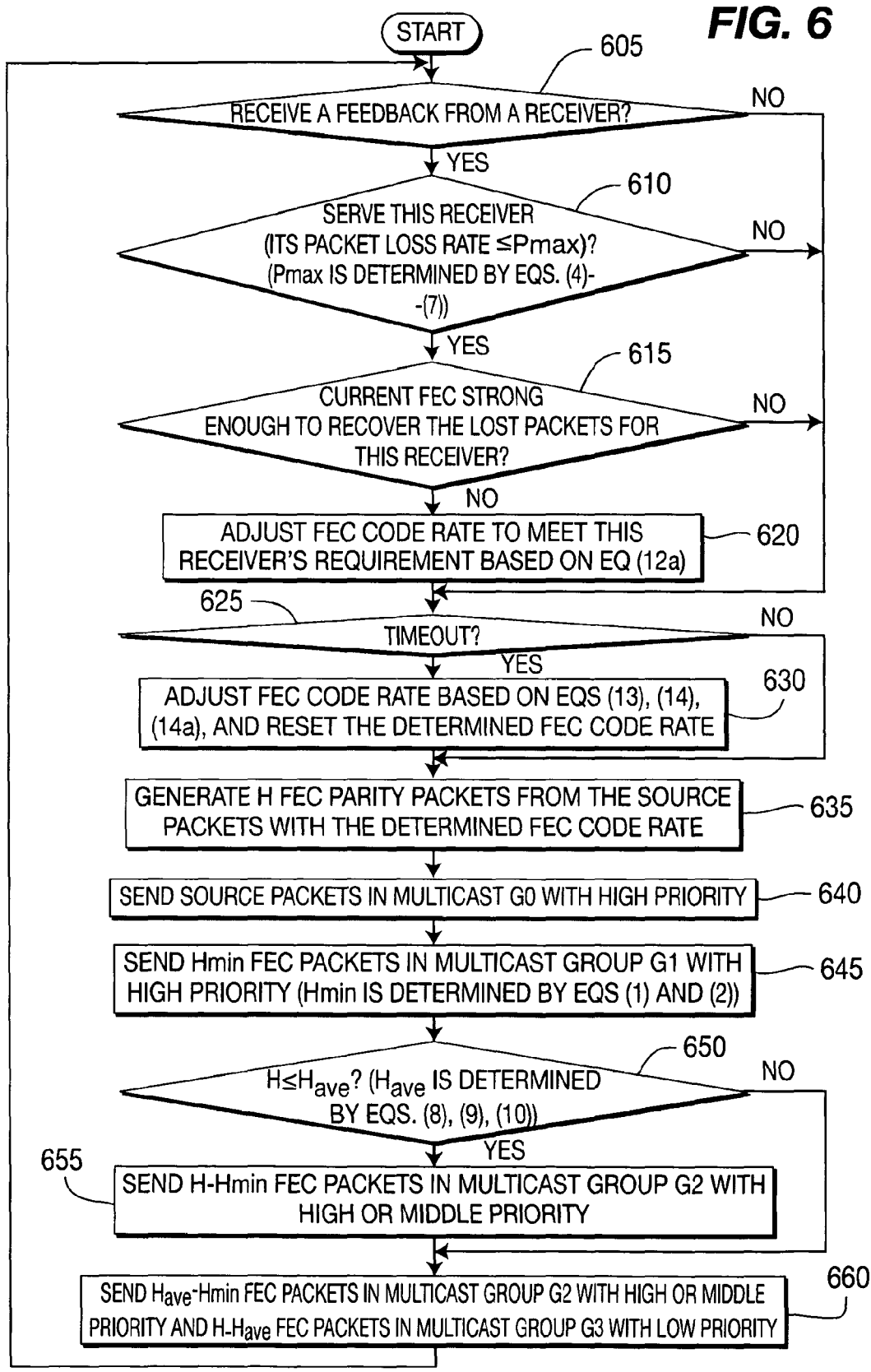
FIG. 6 is a flowchart of an exemplary embodiment of the method of the present invention as practiced at a multicast server.

FIG. 6 is a flowchart of an exemplary embodiment of the method of the present invention as practiced at a multicast server. As used herein, a receiver is any device that can receive information/data/content including for example, a transceiver, computer, laptop, PDA, dual mode smart phone etc. At 605 a test is performed to determine if the multicast/data/media server has received feedback from a receiver. If the multicast server has received feedback from a receiver, then at 610 a test is performed to determine whether to serve that receiver from which feedback was received. That is, the test is if the receiver's packet loss rate is less than or equal to $P_{max}$, where $P_{max}$ satisfies equation 7, which is determined using equations 4-6. At 615 a test is performed to determine if the FEC parity coding (FEC coding rate) is strong enough to recover from packet loss for this receiver given the feedback of channel conditions. If the FEC coding rate is not strong enough then the FEC coding rate is adjusted at 620 using equation 12a. If the FEC coding rate is strong enough then step 620 is bypassed and no adjustment is made to the FEC coding rate. A test is performed at 625 to determine if there has been a timeout (if a time interval has expired). If there has been a timeout then the FEC coding rate is adjusted based on the feedback received from multiple receivers and the FEC adjustment timer is reset at 630. The FEC code rate is adjusted based on equations 13, 14 and 14a. That is, the FEC coding rate may be adjusted at 620 or 630 or both. If there has been no timeout then step 630 is bypassed and no adjustment is made to the FEC coding rate at this time. At 635 the H FEC packets are generated from the source packets using the FEC coding rate including any adjustments made. The source packets and the FEC parity packets are put into different multicast groups having different priorities and transmitted accordingly. Transmission may include alternatively staggercasting and may also include interleaving. The source packets are in multicast group G0 and are transmitted with the highest priority at 640. The $H_{min}$ FEC packets are in multicast group G1 and are transmitted with high priority at 645. $H_{min}$ is determined using equations 1 and 2. At 650 a test is performed to determine if H is less than or equal to $H_{ave}$ where $H_{ave}$ is determined using equations 8 and 9. If H is less than $H_{ave}$ then at 655 $H-H_{min}$ FEC packets are transmitted in multicast group G2 with high or medium priority. If H is less than $H_{ave}$ then step 655 is skipped and $H_{ave}-H_{min}$ FEC packets in multicast group G2 are transmitted with high or medium priority and $H-H_{ave}$ FEC packets in multicast group G3 are transmitted with low priority. Processing then continues at 605. If a determination was made at 610 not to serve this receiver then processing continues at 625. If a determination was made at 605 that no feedback was received from a particular receiver then processing continues at 625.

Figure 7:
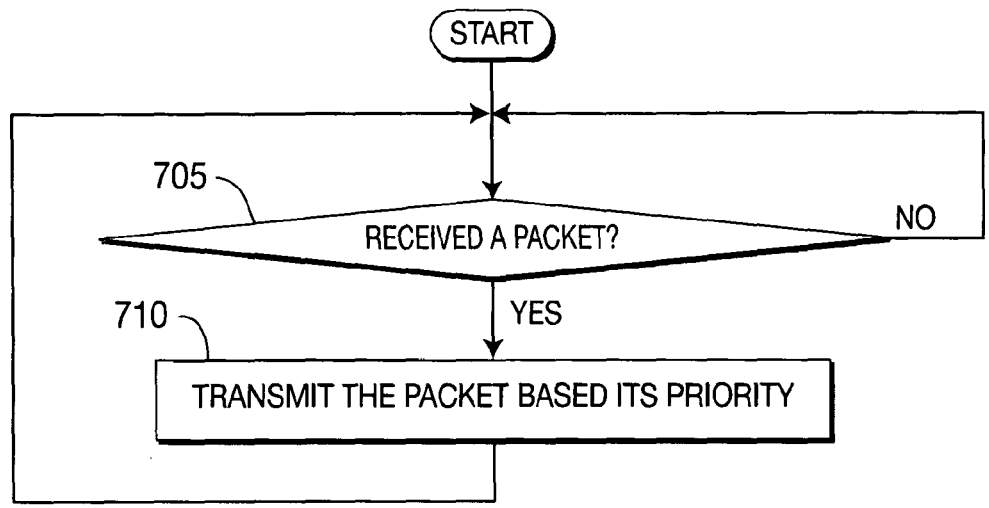
FIG. 7 is a flowchart of an exemplary embodiment of the method of the present invention as practiced at an access point/base station.

FIG. 7 is a flowchart of an exemplary embodiment of the method of the present invention as practiced at an access point/base station. At 705 a determination is made if a packet (source or FEC) has been received at the access point. If a packet has been received then the packet is forwarded to the destination multicast group based on its priority at 710. If no packet was received then processing cycles tightly continuing to test whether a new packet has arrived at 705.

Figure 8:
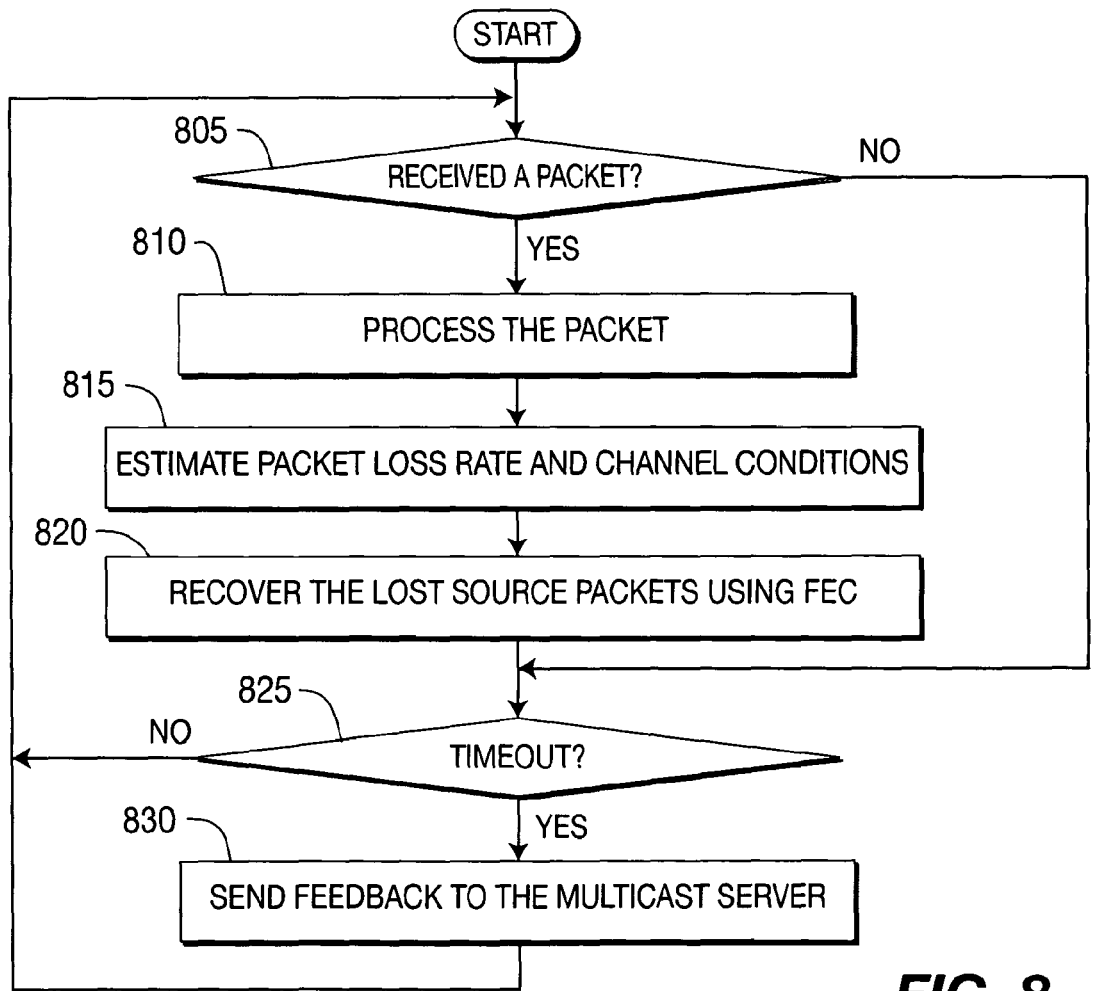
FIG. 8 is a flowchart of an exemplary embodiment of the method of the present invention as practiced at a receiver.

FIG. 8 is a flowchart of an exemplary embodiment of the method of the present invention as practiced at a receiver. At 805 a test is performed to determine if a packet (source or FEC) has been received. If a packet has been received then it is processed at 810. At 815 the receiver estimates the packet loss rate and channel conditions using equation (11). The receiver then recovers any lost source packets using received FEC parity packets at 820. At 825 a test is performed to determine if there has been a timeout. If there has been a timeout then feedback regarding the packet loss rate and channel conditions is sent to the multicast server by way of the access point at 830. If there has been no timeout then processing continues at 805. If no packet has been received at 805 then processing continues at 825.

Wireless link exhibits burst packet loss characteristics due to time-variant multipath fading, interference, shadowing and mobility. An effective method for dealing with burst error channel is to interleave the coded data packets in such a way that a bursty channel is transformed into a channel having independent errors. Thus, a FEC code designed for independent errors (or short bursts) can be used to correct the erroneous packets. In an alternative embodiment of the adaptive forward error correction method of the present invention, interleaving is used. In packet interleaving mechanism with the FEC code, the source packets are reordered by an interleaver before the cross-packet FEC code is used. At the receivers, de-interleaver stores the data packets in the same rectangular array format and FEC decoding is performed. The present invention can be used to determine the FEC code rate and the priorities of the source packets and parity packets in this setting as well.

Another embodiment is one in which the multicast server transmits the original information packet stream and the additional parity packet streams with a time shift, i.e. staggercasting the information stream and parity streams for temporal diversity. The parity packets are delayed in the multicast server's buffer for a time interval T' before the packets are sent out in their multicast groups determined as the above. If information packets are lost in a burst due to shadowing or handover, the corresponding parity packets may not be lost and can be used to recover the lost information packets.

Yet another alternative embodiment is one in which the multicast server delays generating and transmitting the parity packets. After transmitting the source information packets during a time interval T", the multicast server buffers these information packets for a time t and waits for the feedback of channel conditions and packet loss rate of these information packets from the receivers. Based on the packet loss rate of these information packets, the multicast server determines the FEC code rate and the priorities of the parity packets and transmits the parity packets in different multicast groups according to the method of the present invention. By delaying generation of the parity packets and using the feedback of packet loss rate for the information packets to generate the parity packets protecting the source packets, the server can accurately estimate the required FEC code rate.

It is to be understood that the present invention may be implemented in various forms of hardware (e.g. ASIC chip), software, firmware, special purpose processors, or a combination thereof, for example, within a server, an intermediate device (such as a wireless access point or a wireless router) or mobile device. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof), which is executed via the operating system. In addition, various, other peripheral devices may be connected to the computer platform such as an additional data storage device and a printing device.

It is to be further understood that, because some of the constituent system components and method steps depicted in the accompanying figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

The invention claimed is:

1. A method, said method comprising:
  receiving channel condition feedback from a first device over a wireless channel;
  determining, based on said received feedback, whether said first device is served;
  determining responsive to a first determining act and responsive to said received channel condition feedback if a currently used forward error correction coding rate is sufficient for said first device to recover lost data;
  adjusting said currently used forward error correction coding rate responsive to said determining act;
  generating additional forward error correction packets for source data using said adjusted forward error correction coding rate; and
  transmitting to a second device said additional forward error correcting packets in a plurality of multicast groups with different priorities.

2. The method according to claim 1, further comprising:
  adjusting said forward error correction coding rate responsive to receiving feedback from multiple devices in a class of devices if a time interval has expired;
  determining a physical layer mode of operation and a packet size for said source data based on said feedback from multiple devices in said class of devices;
  packetizing said source data responsive to said determined packet size; and
  packetizing forward error correction data responsive to said determined packet size;
  transmitting said packetized source data in a first multicast group and said forward error correction packets in said plurality of multicast groups, said plurality of multicast groups not including said first multicast group and each of said plurality of multicast groups containing different forward error correction packets.

3. The method according to claim 2, wherein said transmitting act is performed responsive to said physical layer mode of operation.

4. The method according to claim 2, wherein said second determining act determines if a packet loss rate is one of less than and equal to a threshold.

5. The method according to claim 2, wherein said second adjusting act is performed based on the forward error correction coding rate required for said multiple receivers in said class to correct their packet loss.

6. The method according to claim 1, wherein said first adjusting act is performed based on the forward error correction coding rate required for said receiver to correct its packet loss.

7. The method according to claim 1, wherein said multicast groups are transmitted based on available bandwidth.

8. The method according to claim 1, wherein said multicast groups are staggercast.

9. The method according to claim 1, wherein said source data packets and said forward error correction packets are interleaved.

10. The method according to claim 1, wherein said method is performed in a server.

11. An apparatus, comprising:
  means for receiving channel condition feedback from a first device over a wireless channel;
  means for determining, based on said received feedback, whether said first device is served;
  means for determining responsive to a first determining means and responsive to said channel condition feedback if a currently used forward error correction coding rate is sufficient for said device to recover lost data;
  means for adjusting said currently used forward error correction coding rate responsive to said determining act;
  means for generating additional forward error correction packets for source data using said adjusted forward error correction coding rate; and
  means for transmitting to a second device said additional forward error correcting packets in a plurality of multicast groups with different priorities.

12. The apparatus according to claim 11, further comprising:
  means for adjusting said forward error correction coding rate responsive to receiving feedback from multiple devices in a class of devices if a time interval has expired;
  means for determining a physical layer mode of operation and a packet size for said source data based on said feedback from multiple devices in said class of devices;
  means for packetizing said source data responsive to said determined packet size; and
  means for packetizing forward error correction data responsive to said determined packet size;
  means for transmitting said packetized source data in a first multicast group and said forward error correction packets in said plurality of multicast groups, said plurality of multicast groups not including said first multicast group, and each of said plurality of multicast groups containing different forward error correction packets.

13. The apparatus according to claim 12, wherein said means for transmitting is performed responsive to said physical layer mode of operation.

14. The apparatus according to claim 12, wherein said second determining means determines if a packet loss rate is one of less than and equal to a threshold.

15. The apparatus according to claim 12, wherein said second adjusting means is based on the forward error correction coding rate required for said multiple receivers in said class to correct their packet loss.

16. The apparatus according to claim 11, wherein said first adjusting means is based on the forward error correction coding rate required for said receiver to correct its packet loss.

17. The apparatus according to claim 11, wherein said multicast groups are transmitted based on available bandwidth.

18. The apparatus according to claim 11, wherein said multicast groups are staggercast.

19. The apparatus according to claim 11, wherein said source data packets and said forward error correction packets are interleaved.

20. The apparatus according to claim 11, wherein said apparatus is a server.

\* \* \* \* \*